United States Patent
Chan et al.

(10) Patent No.: US 7,145,212 B2
(45) Date of Patent: Dec. 5, 2006

(54) METHOD FOR MANUFACTURING DEVICE SUBSTRATE WITH METAL BACK-GATE AND STRUCTURE FORMED THEREBY

(75) Inventors: Kevin K. Chan, Staten Island, NY (US); Lijuan Huang, Mountain View, CA (US); Fenton R. McFeely, Ossining, NY (US); Paul M. Solomon, Yorktown Heights, NY (US); Hon-Sum Philip Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/868,791

(22) Filed: Jun. 17, 2004

(65) Prior Publication Data

US 2004/0235284 A1 Nov. 25, 2004

Related U.S. Application Data

(62) Division of application No. 09/817,120, filed on Mar. 27, 2001, now Pat. No. 6,797,604.

(60) Provisional application No. 60/202,660, filed on May 8, 2000.

(51) Int. Cl.
*H01L 29/76* (2006.01)
(52) U.S. Cl. ............... 257/412; 257/413; 257/E21.122; 438/455

(58) Field of Classification Search ............... 257/412, 257/413, E29.157; 438/455, 585
See application file for complete search history.

(56) References Cited

U.S. PATENT DOCUMENTS

| | | | | |
|---|---|---|---|---|
| 4,771,016 A | * | 9/1988 | Bajor et al. ............... | 438/455 |
| 4,826,787 A | | 5/1989 | Muto et al. | |
| 4,927,505 A | * | 5/1990 | Sharma et al. ............. | 205/123 |
| 5,250,460 A | | 10/1993 | Yamagata et al. | |
| 5,387,555 A | * | 2/1995 | Linn et al. .................. | 438/455 |
| 5,391,257 A | | 2/1995 | Sullivan et al. | |
| 5,872,385 A | * | 2/1999 | Taft et al. ................... | 257/437 |
| 6,049,114 A | | 4/2000 | Maiti et al. | |
| 6,057,212 A | | 5/2000 | Chan et al. | |
| 6,218,274 B1 | | 4/2001 | Komatsu | |
| 6,238,737 B1 | | 5/2001 | Chan et al. | |
| 6,255,731 B1 | * | 7/2001 | Ohmi et al. ................ | 257/758 |
| 6,362,075 B1 | * | 3/2002 | Czagas et al. ............. | 438/455 |
| 6,373,114 B1 | * | 4/2002 | Jeng et al. .................. | 257/413 |

\* cited by examiner

*Primary Examiner*—Kenneth Parker
*Assistant Examiner*—José R. Diaz
(74) *Attorney, Agent, or Firm*—Wan Yee Cheung, Esq.; McGinn IP Law Group, PLLC

(57) ABSTRACT

A method (and resultant structure) of forming a semiconductor device, includes forming a metal-back-gate over a substrate and a metal back-gate, forming a passivation layer on the metal back-gate to prevent the metal back-gate from reacting with radical species, and providing an intermediate gluing layer between the substrate and the metal back-gate to enhance adhesion.

16 Claims, 6 Drawing Sheets

METHOD FOR MANUFACTURING DEVICE SUBSTRATE WITH METAL BACK-GATE AND STRUCTURE FORMED THEREBY

CROSS-REFERENCE TO RELATED APPLICATION

The present Application is a Divisional Application of U.S. patent application Ser. No. 09/817,120, filed on Mar. 27, 2001 U.S. Pat. No. 6,797,604.

The present application is related to and claims priority from U.S. Provisional Patent Application No. 60/202,660, filed on May 8, 2000, to Chan et al., entitled "METHOD FOR MANUFACTURING DEVICE SUBSTRATE WITH METAL BACK-GATE AND STRUCTURE FORMED THEREBY", assigned to the present assignee, and incorporated herein by reference.

U.S. GOVERNMENT RIGHTS UNDER THE INVENTION

Work related to or leading to the present invention was partially supported by the U.S. Defense Advanced Research Projects Agency (DARPA) under grant N6601-97-8908.

BACKGROUND OF THE INVENTION

1. Field of the Invention

The present invention relates to a method for forming a device substrate and more particularly to a method for forming a device substrate with a metal back-gate and the structure formed thereby.

2. Description of the Related Art

Laminating a thin metal layer (e.g., tungsten (W)) between silicon-based materials such as a gate oxide and a buried oxide is a key step to making substrates for double-gate devices with a metal back-gate. Because of its flexibility with all kinds of materials, even if the materials are polycrystalline, amorphous, or single crystalline but with very different lattice mismatch, wafer bonding is a promising approach to make this multilayer structure.

However, for the bonding process, after the room-temperature joining step, a thermal treatment at 1100° C. is commonly used to enhance the bonding strength. Due to the weak adhesion at the interface between metals and silicon oxide as a result of their chemical and physical incompatibility such as thermal mismatch, the stacked layers are very likely to disintegrate during the high temperature bonding anneal in the form of delamination at weak interfaces. This problem has been observed experimentally and this conventional process is schematically shown in FIG. 1. In the case of tungsten bonding with silicon dioxide, tungsten reacts with oxygen from silicon dioxide to form tungsten oxide ($WO_3$), which its volume increases dramatically (3×) and causes delamination, during high temperature bonding anneal.

SUMMARY OF THE INVENTION

In view of the foregoing and other problems, disadvantages, and drawbacks of the conventional methods and structures, an object of the present invention is to provide a method (and structure formed thereby) in which a device substrate is formed with a metal back-gate.

In a first aspect of the present invention, a method for forming a device substrate having a metal back-gate, includes providing a substrate, forming a metal back-gate on the substrate and forming an intermediate "gluing" layer on the back-gate to enhance adhesion between the back-gate and the subsequent layers (e.g., especially two layers with very different chemical and physical properties).

With the unique and unobvious aspects of the present invention, making substrates for double-gate devices with a metal back-gate can be performed including using wafer bonding and despite after the room-temperature joining step, a thermal treatment at 1100° C. is used to enhance the bonding strength. That is, even with chemical and physical incompatibility of layers, the stacked layers are not likely to disintegrate during the high temperature bonding anneal, and delamination will not occur at the interfaces.

Thus, the present invention resolves the above-mentioned and other problems of delamination between W and low temperature oxide (LTO) during bonding anneal by improving the adhesion between these two incompatible materials with several innovative processes.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
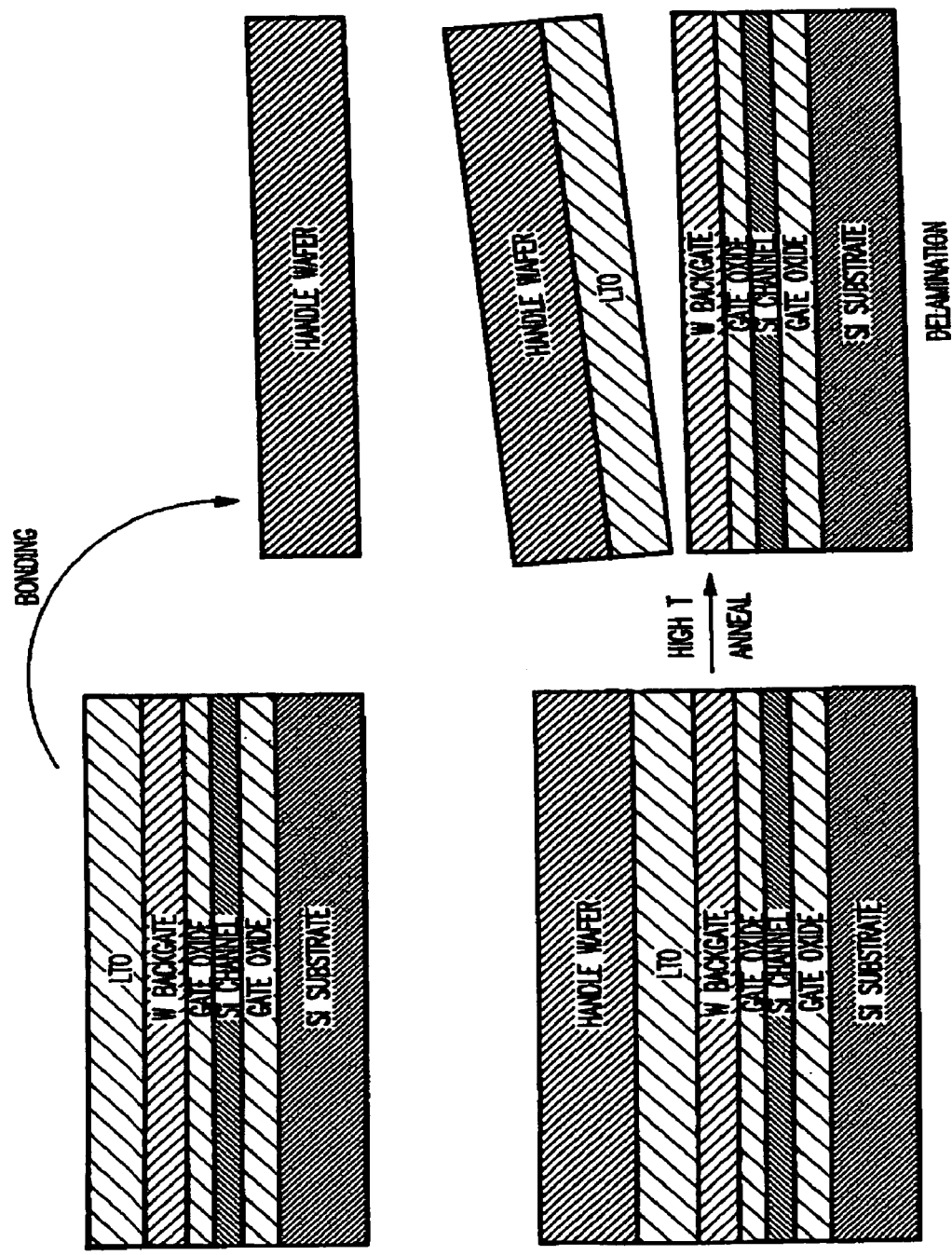
FIG. 1 illustrates schematically a conventional processing.

Referring now to the drawings, and more particularly to FIGS. 2–5, there are shown preferred embodiments of the method and structures according to the present invention.

Figure 4:
FIG. 4 illustrates photographically a device silicon substrate with a tungsten backplane.

As mentioned above, the present invention resolves the above-mentioned and other problems of delamination between metals (e.g., W, TiN, etc.; W will be assumed in the example described below) and low temperature oxide (LTO) during bonding anneal by improving the adhesion between these two incompatible materials with several innovative processes. As such, an 8" device substrate with W as the back-plane has been demonstrated for the first time, as shown in FIG. 4 which is a photograph of the 8" device substrate.

A key aspect of the method of the present invention is to use an intermediate "gluing" layer to enhance adhesion between multi-layers especially two layers with very different chemical and physical properties.

It is noted that this aspect can be well extended from a W back-gate to other metals or salicide (such as Ti-Nitride) back-gate substrates. Due to its readiness of forming silicide with metals and its compatibility with Si-based materials, a-Si is a desirable intermediate layer. Other intermediate layers may include silicon nitride, or poly-silicon. Further, it is noted that the intermediate layer could include the passivation layer as one of its layers, or the passivation layer could be used in addition to the intermediate layer(s).

The inventive process 200 is shown schematically in FIGS. 2A–2B and 3A–3C.

Figure 2A:
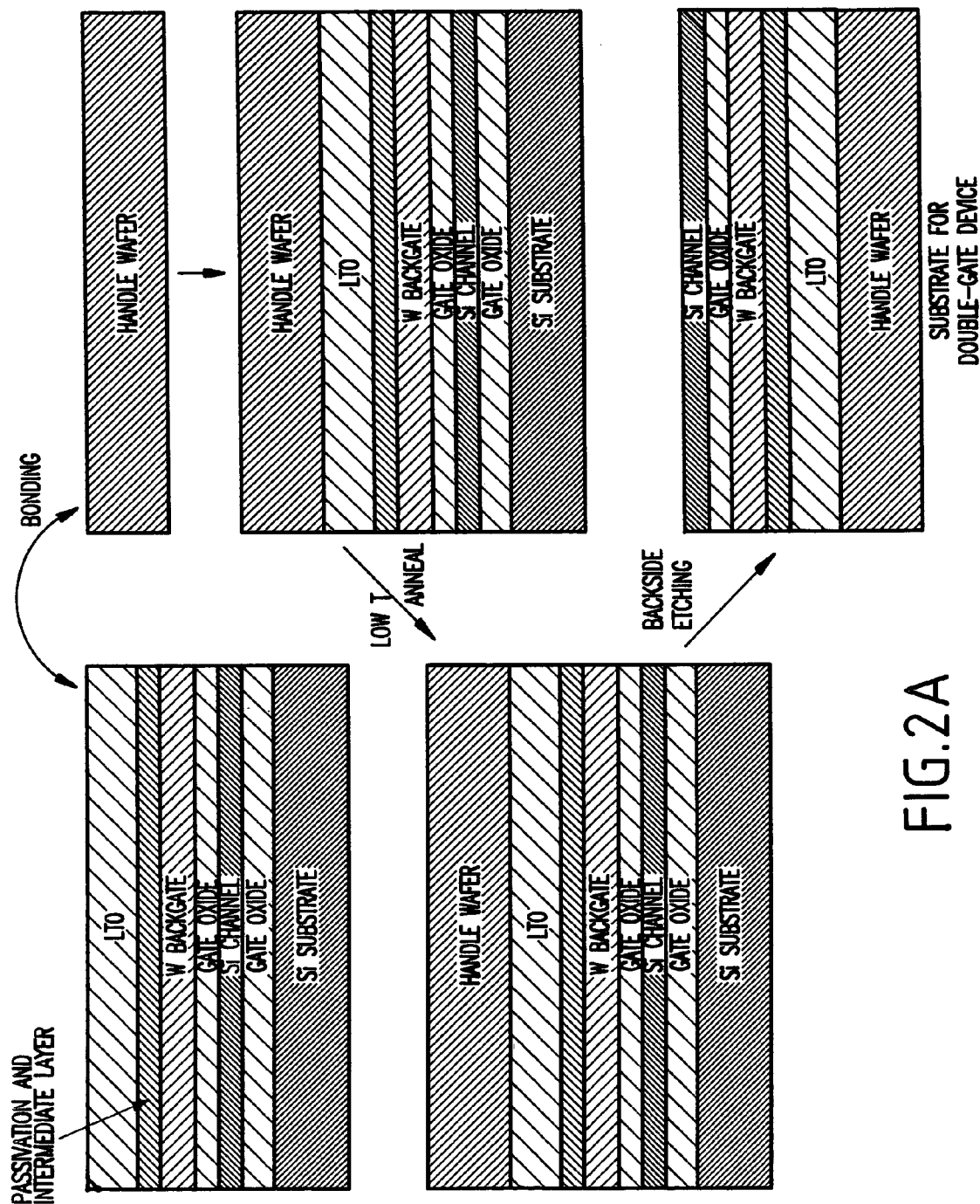
FIG. 2A illustrates schematically the process of the present invention.
Figure 2B:
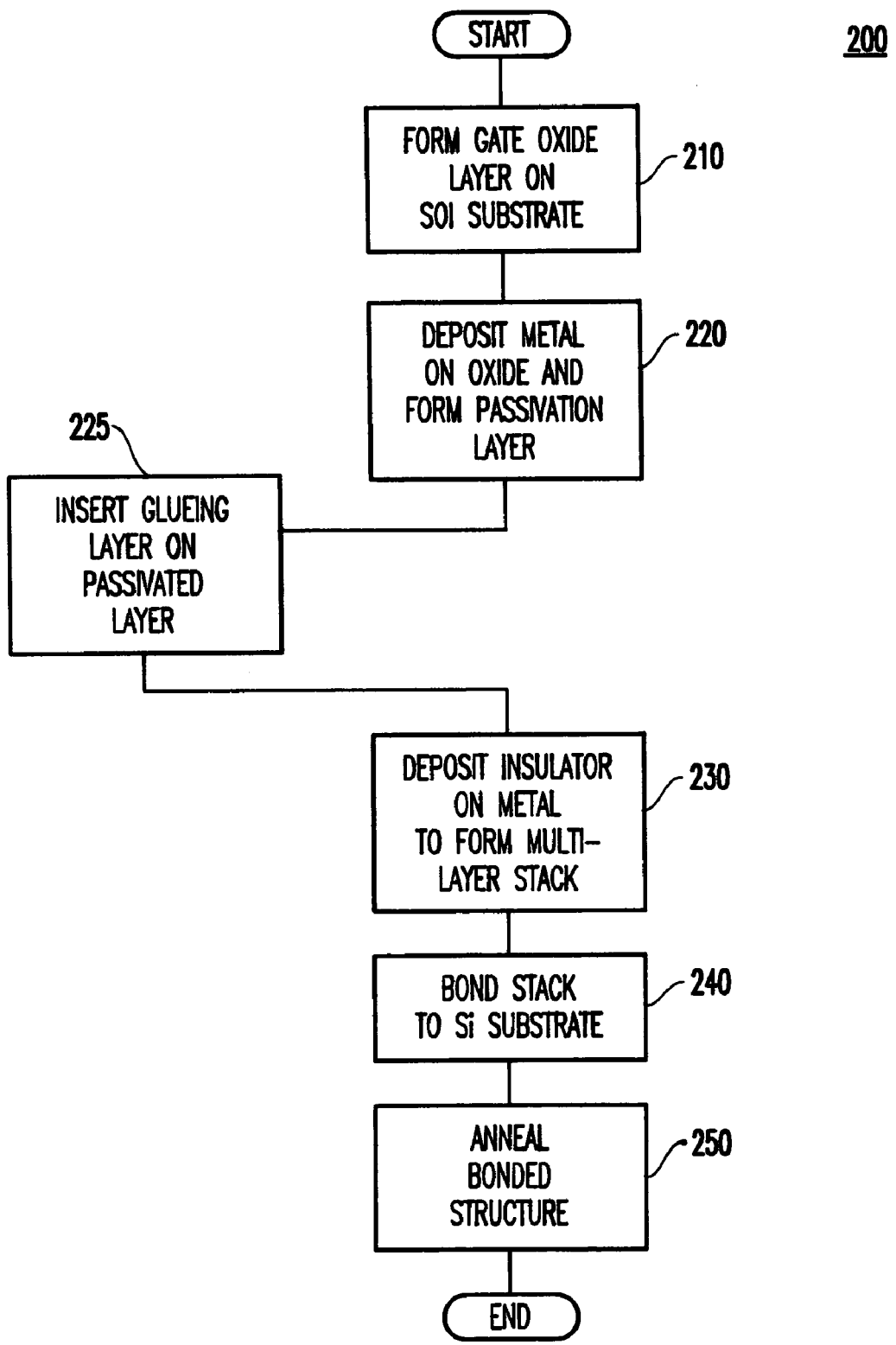
FIG. 2B illustrates a flow diagram of the inventive process.
Figure 3A:
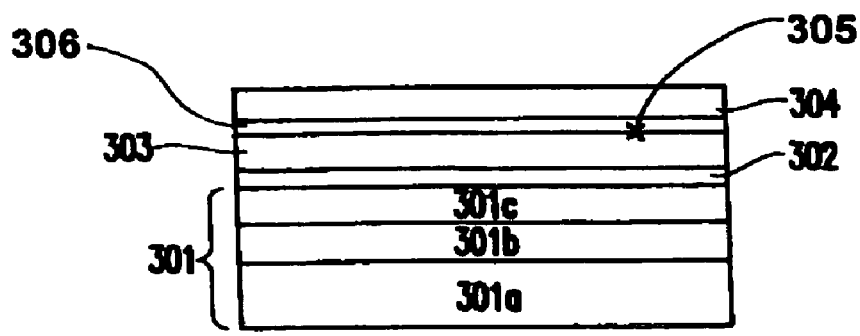
FIGS. 3A–3C show the details of the process of FIG. 2.

As described in further detail below, as shown in FIG. 2B and FIG. 3A, the method includes growing a thin gate oxide layer 302 on a SOI substrate 301 (e.g., having a thickness of about 500–750 μm in a preferred application and including a silicon substrate 301a, an oxide 301b, and a SOI layer 301c) (step 210).

Then, in step 220, a physical vapor deposited (PVD) or chemical vapor deposited (CVD) metal 303 (e.g., tungsten, TiN, etc.; for ease of explanation below, the example of tungsten will be described) layer is deposited on the gate oxide. Preferably, the PVD/CVD metal 303 has a thickness sufficient to avoid leakage current and to maintaining the integrity of the material. For example, the PVD/CVD metal 303 may have a thickness of about 20 nm to about 500 nm. Then, the PVD/CVD tungsten layer 303 is passivated. The passivation layer 305 preferably has a thickness of between about 0.2 to about 2 nm.

In step 225, intermediate gluing layer(s) 306 are formed on top of the passivated PVD/CVD W layer 303.

Thereafter, in step 230, an insulating material 304 such as a low temperature oxide (LTO) (AlOx, SiN, etc.; for ease of explanation, LTO will be assumed and described in the example below) is deposited on the W layer 303 and is smoothed with a chemical mechanical polishing (CMP).

Figure 3B:
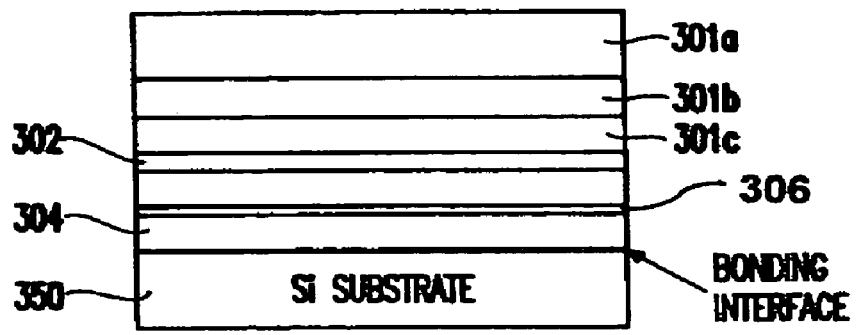

As shown in FIG. 3B, in step 240, the polished substrate with a multilayer stack is bonded to a monitor grade Si substrate 350 (e.g., approximately 750 μm in thickness).

In step 250, the bonded structure is annealed at elevated temperatures to strengthen the bonding across the bonding interface.

Figure 3C:
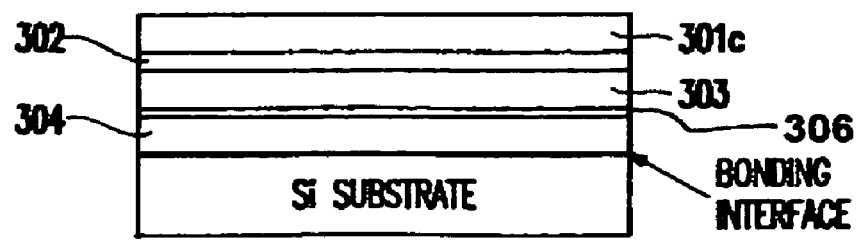

The final 750 μm SOI substrate with W ground plane is shown in FIG. 3C and is achieved by polishing and wet etching processes. This composite substrate with buried tungsten ground plane can be utilized to fabricate nano-scale double gate SOI devices with metal gates.

It is noted that the PVD/CVD W layer 303 is passivated before the LTO deposition to prevent the reaction of W with oxygen and the subsequent delamination at the metal (W) 303-LTO (which has a radical species such as OH or O, etc.) interface. The passivation of the PVD/CVD W layer 303 is preferably performed as described below.

In addition to the W passivation layer, several other intermediate layers have been tried to improve the compatibility of W and LTO. With the developed W passivation layer and intermediate layers, very good adhesion between W and $SiO_2$ layer is achieved and the multilayer structure remains intact during annealing at temperatures below 1100 C.

Thus, the inventive process contains three important aspects, as described in detail below, to achieve the above-mentioned and other advantages of the present invention.

As shown in FIGS. 2A–2B, a first important aspect is to form a thin W passivation layer after PVD/CVD W deposition (step 220).

The forming of the W passivation layer (e.g., cap) includes conducting an ultra high vacuum (UHV) desorption of native oxide on W under an atmosphere of approximately $10^{-9}$ torr for 5 mm at approximately 750° C. for about 5 min. Then, a monolayer of W—Si silicide is formed at approximately 625° C. for approximately 1.5 min. reaction with $SiH_4$. The bare W surface reacts with Si to form a monolayer of W—Si.

Thereafter, nitridation of W—Si occurs at about 750° C. for about 30 mm. with $NH_3$. Active $NH_2$, NH, species react with W—Si to form W—Si—N. This passivation layer has the structure of W—Si—N (e.g., see attached Auger Profile analysis results in FIG. 5), and is effective in preventing W from being oxidized in the subsequent processing steps (e.g., see associated patent disclosure of "Method for Protecting Refractory Metal Thin Film Requiring High Temperature Processing in an Oxidizing Atmosphere and Structure Formed Thereby"(U.S. patent application Ser. No. 09/337,550, now U.S. Pat. No. 6,238,737, issued May 29, 2001, having IBM Disclosure No. YOR8-1998-0774, incorporated herein by reference).

Figure 5:
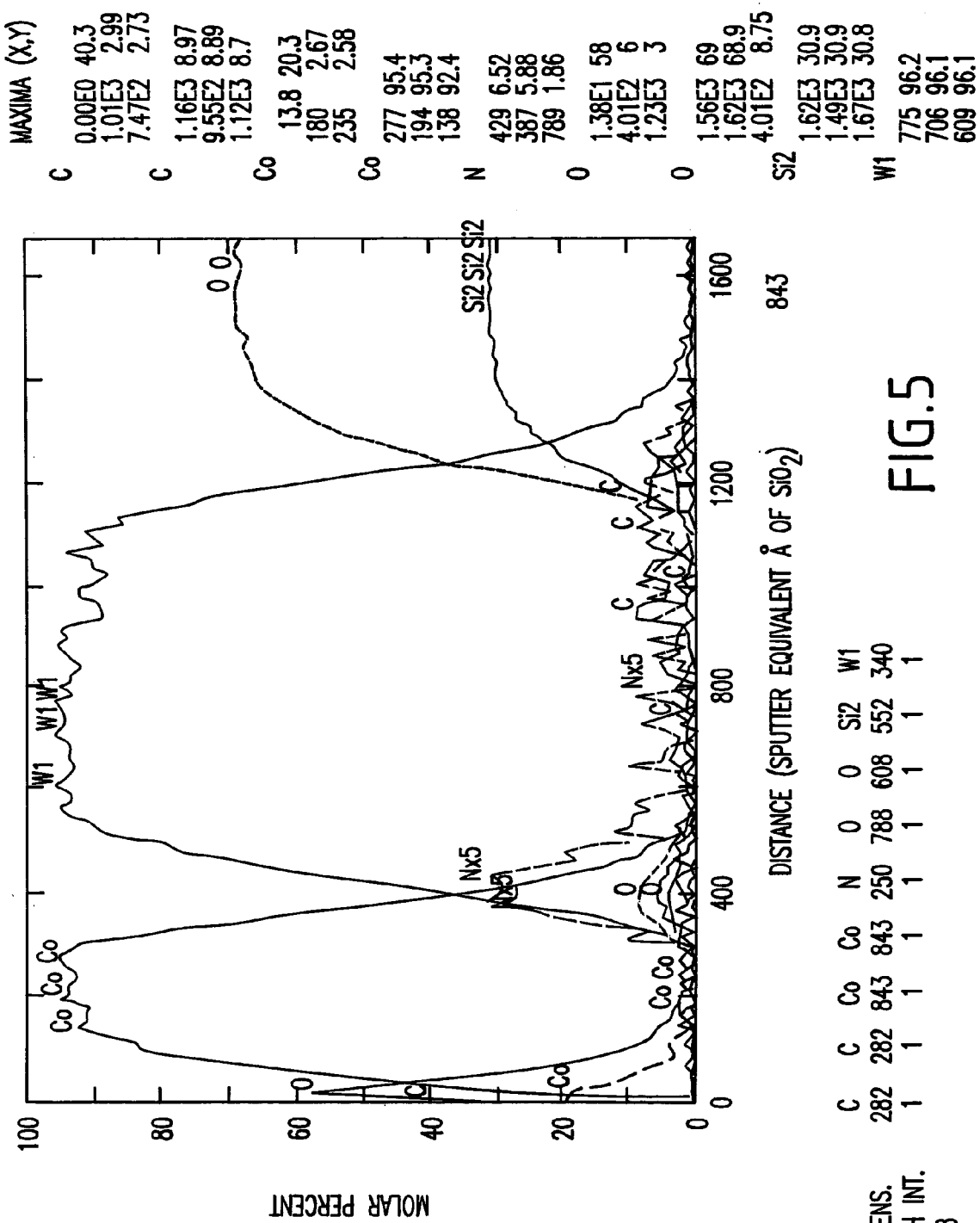
FIG. 5 illustrates analytical results of the process.

That is, FIG. 5 shows a plot of the molar percent to the distance (sputter equivalent Å of $SiO_2$). As shown in FIG. 5, at the interface between the W and Co, on the surface of the passivated tungsten, there is a peak of silicon and nitrogen (Si, N, or Si—N) which prevents the reaction of tungsten with oxygen. Thus, the benefit of using W as a passivation layer is evident. The monolayer of the intermediate layers serves to passivate the W to prevent any oxygen-containing species from reacting with the W. Thus, adhesion must be improved and to do so, the invention employs a amorphous silicon layer, a silicon nitride layer or a combination thereof, such that the temperature of the monolayer structure can withstand is significantly increased.

Thus, a second important aspect is to preferably insert intermediate layers such as a-Si, $Si_3N_4$ or a combined layer of a-Si and $Si_3N_4$ on top of an encapsulated W layer before the low temperature oxide (LTO) deposition (e.g., conducted at a temperature between about 500° C. to about 750° C.). Preferably, to reduce thermal stress induced by the mismatch of thermal expansion coefficient between different materials, the fewer the number of intermediate layers, the better. Preferably, the intermediate layers have a thickness of about 3 nm to about 20 nm. These intermediate layers are more compatible with LTO layers due to their similar chemical composition than a metal material.

In addition, the thin a-Si or $Si_3N_4$ intermediate layers will react with the PVD/CVD tungsten and form tungsten silicide during high temperature anneal (e.g., preferably conducted at a temperature within a range of about 300° C. to about 600° C.). Preferably the amorphous silicon layer has a thickness of at least 5 nm. The nitride layer would preferably have a thickness of at least 2 nm. Thin films are preferable.

Therefore, these intermediate layers serve as a "gluing" layer between a metal, such as W, and silicon oxide, in addition to the W—S—N passivation layer. As a result, the adhesion between W and the LTO is significantly enhanced. The improved adhesion is supported by the fact that 8" bonded wafers survived mechanical grinding process (e.g., approx. 320 grit on the first wheel and approx. 2000 grit on the second) and severe chemical etching (e.g., 2 hours in 25% KOH solution at 80° C.). The W passivation layer preferably has a thickness of between about 0.2 nm to about 2 nm. It is noted that while the passivation layer is discussed above as containing nitrogen, a $SiC_x$ layer or a SiNx could be employed as the passivation layer.

The passivation layer can be provided separately from the intermediate glueing layer or can be a part thereof.

A third innovation of the present invention is to reduce the bonding anneal temperature from 1100° C. to 650° C.–950° C. (e.g., performed in step 250). Low temperature bonding anneal has the combined benefits of keeping the W passivation layer intact, maintaining the integrity of other materials especially the gate oxide, and minimizing the thermal stress in the multi-layer stack.

A thin layer of a-Si or BPSG (e.g., preferably having a thickness of about 3 nm to about 10 nm) with a lower flowing temperature can be used to enhance the bonding strength at bonding temperatures lower than 1100° C. FIGS. 2A and 3A–3C illustrate the process of the invention schematically.

While the invention has been described in terms of a preferred embodiment, those skilled in the art will recognize that the invention can be practiced with modification within the spirit and scope of the appended claims.

The invention claimed is:

1. A semiconductor device, comprising:
   a first substrate;
   a gate structure comprising a plurality of layers formed on said first substrate;
   a metal back-gate formed over said gate structure;
   a passivation layer formed on the metal back-gate, said passivation layer having a characteristic of preventing the metal from reacting with radical species; and
   an intermediate gluing layer formed on said passivation layer to enhance an adhesion between said metal back-gate and a second substrate that can be bonded to said semiconductor device.

2. The device of claim 1, wherein said substrate comprises a silicon-on-insulator substrate having a gate oxide formed thereon.

3. The device of claim 1, wherein said second substrate is bonded and said device with said second substrate bonded thereto is annealed to strengthen the bond across the bonding interface.

4. A semiconductor device comprising:
   a substrate;
   a low temperature oxide layer bonded to said substrate;
   an intermediate gluing layer;
   a metal back-gate having a passivation layer, said passivation layer having a characteristic of preventing the metal from reacting with radical species; and
   at least one layer of a gate structure on said metal back-gate,
   wherein said intermediate gluing layer enhances an adhesion between said metal back-gate and said low temperature oxide layer.

5. A semiconductor device, comprising:
   a substrate;
   a metal back-gate formed over said substrate;
   a passivation layer formed on the metal back-gate to prevent the metal from reacting with radical species, said passivation layer formed on a side of said metal back-gate nearest to said substrate; and
   an intermediate gluing layer formed under said passivation layer that enhances an adhesion between said metal back-gate and said substrate.

6. The device of claim 5, wherein said intermediate gluing layer comprises one of a-Si, $Si_3N_4$ and a combined layer of a-Si and $Si_3N_4$.

7. The device of claim 5, wherein said metal back-gate includes W, and said passivation layer comprises a thin W passivation layer.

8. The device of claim 7, wherein said W comprises a plasma vapor deposition (PVD) W.

9. The device of claim 7, wherein said W comprises a chemical vapor deposition (CVD) W.

10. The device of claim 5, wherein said passivation layer comprises:
    an UHV desorption of native oxide on W formed under a pressure of $10^{-9}$ torr at 750° C. for 5 minutes;
    a monolayer of W—Si silicide formed at 625° C. for 1.5 min. reaction with $SiH_4$ such that a bare W surface reacts with Si to form a monolayer of W—Si; and
    a nitridation of W—Si formed at 750° C. for 30 min. with $NH_3$ and reacting active $NH_2$ with W—Si to form W—Si—N.

11. The device of claim 5, wherein said metal back-gate is formed of a metal having a high melting temperature to withstand thermal treatment during semiconductor processing.

12. The device of claim 5, wherein said metal back-gate comprise one of tungsten and titanium nitride.

13. The device of claim 5, wherein said metal back-gate comprises a tungsten layer, said tungsten layer being adjacent to a gate oxide.

14. The device of claim 5, wherein the metal back-gate comprise a W layer, and wherein a low temperature oxide (LTO) is deposited on the W layer.

15. The device of claim 14, wherein said W layer is passivated before the LTO deposition to prevent a reaction of tungsten with oxygen and a delamination at a W—$SiO_2$ interface.

16. The device of claim 5, wherein said intermediate gluing layer comprises a Si-based intermediate layer.

* * * * *